(12) United States Patent
Ice et al.

(10) Patent No.: US 7,508,677 B2
(45) Date of Patent: Mar. 24, 2009

(54) DETACHABLE MODULE CONNECTOR

(75) Inventors: Donald A. Ice, Milpitas, CA (US); Stephen T. Nelson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/928,414

(22) Filed: Aug. 26, 2004

(65) Prior Publication Data

US 2005/0026469 A1 Feb. 3, 2005

Related U.S. Application Data

(63) Continuation of application No. 10/378,708, filed on Mar. 3, 2003.

(51) Int. Cl.
*H05K 5/00* (2006.01)
(52) U.S. Cl. .................. 361/752; 361/797; 361/790
(58) Field of Classification Search .......... 361/715, 361/737, 752, 797, 760, 720, 727; 439/362, 439/638, 654, 377
See application file for complete search history.

(56) References Cited

U.S. PATENT DOCUMENTS

| | | | | |
|---|---|---|---|---|
| 5,151,034 A | * | 9/1992 | Chandler et al. .......... 439/79 |
| 5,515,468 A | * | 5/1996 | DeAndrea et al. ........ 385/88 |
| 5,617,297 A | * | 4/1997 | Lo et al. .................. 361/737 |
| 5,767,999 A | * | 6/1998 | Kayner .................... 398/164 |
| 6,135,644 A | * | 10/2000 | Hakogi et al. ............ 385/92 |
| 6,168,469 B1 | * | 1/2001 | Lu ........................... 439/608 |
| 6,220,873 B1 | * | 4/2001 | Samela et al. ........... 439/76.1 |
| 6,241,534 B1 | * | 6/2001 | Neer et al. ............... 439/76.1 |
| 6,619,859 B1 | | 9/2003 | Minamino et al. |
| 6,628,854 B1 | | 9/2003 | Koh et al. |
| 6,908,342 B2 | * | 6/2005 | Shimada .................. 439/630 |
| 2002/0131730 A1 | * | 9/2002 | Keeble et al. ............ 385/92 |

* cited by examiner

*Primary Examiner*—Hung S Bui
(74) *Attorney, Agent, or Firm*—Workman Nydegger

(57) ABSTRACT

Presented is a detachable module connector comprising a main body with a first section, a second section, and a first opening extending through the first section and the second section, wherein the inner dimensions of the opening in the first section are different from the inner dimensions of the opening in the second section and the opening in the first section is sized to fit around a printed circuit board. The detachable connector is used to couple an electronic module that includes a printed circuit board to a host device. Also presented is a method of building a module using this detachable connector. The detachable connector simplifies the module manufacturing process because the module does not involve the costly hand-soldering and pcb-turning steps of the conventional methods.

22 Claims, 14 Drawing Sheets

US 7,508,677 B2

DETACHABLE MODULE CONNECTOR

CROSS-REFERENCE TO RELATED APPLICATIONS

This application is a continuation, and claims the benefit, of U.S. patent application Ser. No. 10/378,708, entitled MODULE HOUSING FOR IMPROVED ELECTROMAGNETIC RADIATION CONTAINMENT, filed Mar. 3, 2003, and incorporated herein in its entirety by this reference.

BACKGROUND OF THE INVENTION

The Field of the Invention

The invention relates generally to electronic modules and particularly to optoelectronic transceiver modules.

Today, communication systems using optical fiber as a means for transmission are widely employed for a variety of purposes ranging from a basic transmission line in public communication channel to a short-distance network such as a LAN (local area network). Since most of the devices connected by these optical fibers are electronic devices rather than optical devices, optical transceivers are commonly placed at the interface between the optical fibers and the electronic devices. An optical transceiver commonly includes an optical transmitter that receives electric signals and converts them into optical signals, and an optical receiver that receives optical signals and converts them into electric signals.

Electrical/optical transceivers, therefore, are designed to be electrically and/or optically coupled to a host device and to a transmission line (to a network, to another device, etc.). Typically, transceivers are packaged in the form of a module that has a host device end and a transmission end. At the host device end, the transceiver module may be mounted on a motherboard of a host device and/or mechanically plugged into a panel that is coupled to the host device. At the transmission end, the transceiver module is mechanically coupled with a signal transfer medium such as an electrical wire or an optical fiber. There are a number of different mechanical interfaces with the optical transceiver which have been used in the past and have evolved into industry standards.

Typically, a transceiver module is physically coupled to the host device with a plastic connector that is soldered onto one end of the printed circuit board (pcb) of the transceiver. The plastic connector is dimensioned to fit with a standard-sized mating structure on the host device. When the transceiver module is physically mated to the host device with this connector, electrical leads and signal ground pins on the transceiver pcb become connected to the appropriate electrical portions of the host device.

While the plastic connector provides a method of electrically coupling the pcb to the host device, it is a source of inconvenience from a manufacturing standpoint. Since the polymeric material that the plastic connector is made of usually cannot withstand the heat that is applied during reflow soldering, the plastic connector has to be hand-soldered onto the board after electronic components are reflow-soldered on to the board. This hand-soldering process, which involves individually hand-soldering each of multiple (e.g., 20) leads to the plastic connector, lengthens the manufacturing process and drives up the cost of a transceiver module. The signal ground pins, which are usually insert molded into the plastic connector, are difficult to work with because they are designed to connect to the pcb from two opposite surfaces of the pcb. Thus, the manufacturing process involves turning the pcb upside down to achieve high-quality soldering on both sides of the pcb. This step of turning the pcb upside down also lengthens and complicates the manufacturing process.

Furthermore, because the optical signal operates at a high frequency, conversion of the optical signal to an electrical signal results in generation of electromagnetic radiation. Since the plastic connector does not block electromagnetic radiation effectively, a significant fraction of the electromagnetic radiation leakage to the host device. This leak is highly undesirable, as electromagnetic radiation is known to interfere with the performance of the host device. This leak of electromagnetic radiation makes it difficult for the transceiver module to comply with certain FCC regulations that require minimization of electromagnetic radiation.

A method of connecting the transceiver to a host device without the above-described disadvantages is desirable.

BRIEF SUMMARY OF THE INVENTION

Presented is a detachable module connector comprising a first section, a second section, and a first opening extending through the first section and the second section, wherein the inner dimensions of the opening in the first section are different from the inner dimensions of the opening in the second section and the opening in the first section is sized to fit around a printed circuit board. The detachable connector is used to build an electronic module that includes a printed circuit board and a housing encapsulating the printed circuit board. The detachable connector allows the module to be coupled to another device. Also presented is a method of building a module using the detachable connector. The detachable connector eliminates the need for the expensive and time-consuming hand-soldering and pcb-turning steps of the conventional methods.

DETAILED DESCRIPTION OF THE PREFERRED EMBODIMENTS

The present invention is directed to an optoelectronic transceiver module, and it will be described in that context. However, it will be appreciated that the teachings of the present invention are applicable to any electrical device including a printed circuit board that is coupled to another device.

Figure 1:
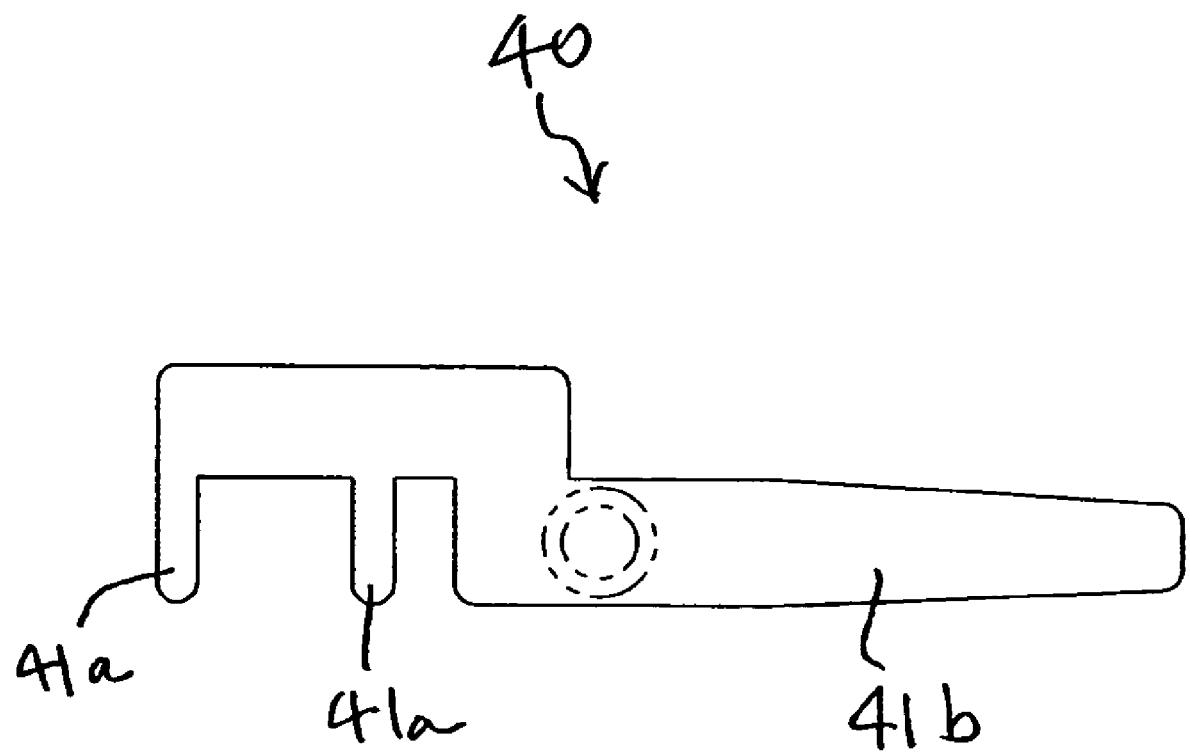
FIG. 1 is a side view of an exemplary pin in accordance to the invention.

FIG. 1 depicts an exemplary pin 40 in accordance with the invention. The pin 40, which has protrusions 41a and an extension 41b, is made of any electrically conductive material, such as metal, using a conventional method. Since the protrusions 41a extend in only one direction, coupling the pin 40 with a printed circuit board (pcb) does not require working on both sides of the printed circuit board. The protrusions 41a may simply be inserted into openings in the printed circuit board and soldered. Preferably, the pin 40 is reflow-soldered onto the pcb during an automatic soldering process for process efficiency.

Figure 2A:
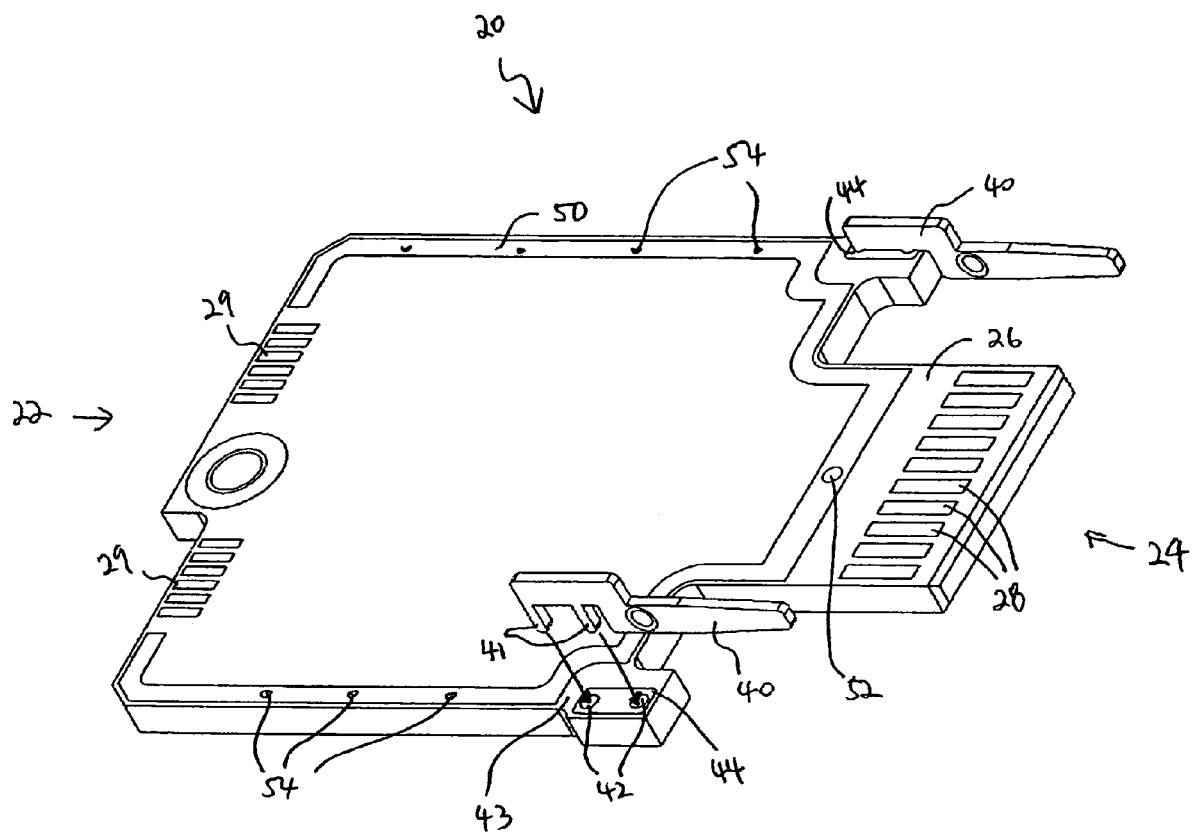
FIG. 2A, FIG. 2B, and FIG. 2C are a perspective view, a top view, and a side view, respectively, of the pin of FIG. 1 coupled to a printed circuit board.

FIG. 2A depicts the pin 40 coupled to a pcb 20 that may be used to implement the invention. The pcb 20 has a transmission end 22 and a host device end 24. At or near the host device end 24 is a subsection 26 and pins 40. A set of leads 28 are arranged on the subsection 26 in the manner that will make them contact the appropriate electrical portions of a host device (not shown) when the board 20 is coupled to the host device. The leads 28 may be placed on the pcb 20 by any of the conventional methods (e.g., electroplating) and be connected to select parts of the circuit on the pcb 20. Likewise, the pins 40 are shaped and arranged to ensure a formation of an appropriate electrical contact with the host device. At or near the transmission end 22 are transmission leads 29, which may be coupled to electrical/optical components such as modular transmitter/receiver subassemblies (e.g., TOSA and ROSA).

If the pin 40 is used as a signal ground pin, the extension 41b is designed to connect with the signal ground portion of the host device before the leads 28 connect with the host device, in order to prevent any device damage from electrostatic discharge. Further, if the pins 40 are signal ground pins, they must be selectively isolated from other electrical components on the board. In the embodiment of FIG. 1, the electrically conductive pad 44 that contacts the pin 40 is surrounded by a nonconductive portion 43. The conductive pad 44 is electrically coupled to selective parts (not shown) of the circuit in/on the pcb 20, which is a multi-layer board. As shown, the conductive pad 44 preferably has holes 42 therein into which protrusions 41a of the pin 40 is inserted before being soldered.

The board 20 preferably includes a chassis ground section on both the top and bottom surfaces, such as the chassis ground ring 50 that is shown. The chassis ground ring 50 is positioned near one or more edges of the pcb. A chassis-ground hole 52 may be formed on the chassis ground ring 50. Although FIG. 2 depicts only one chassis-ground hole 52 positioned near the subsection 26, the invention is not limited to any particular size, location, or number of chassis-ground hole 52. In addition to the chassis-ground hole 52, via holes 54 are formed on the chassis ground ring 50, connecting the chassis ground sections on the top and bottom surfaces of the pcb 20. The inner walls of the via holes 54 are coated with conductive material, which become chassis-ground when placed in contact with the chassis ground sections. Any number of chassis-ground hole 52 may be positioned along the chassis-ground section of the pcb 20, some of which may be via holes that are much smaller than the chassis-ground hole 52 that is shown. The chassis ground ring 50 and the hole 52 help contain the electromagnetic radiation emitted by the electrical components within the module, as will be described below in more detail.

Figure 2B:
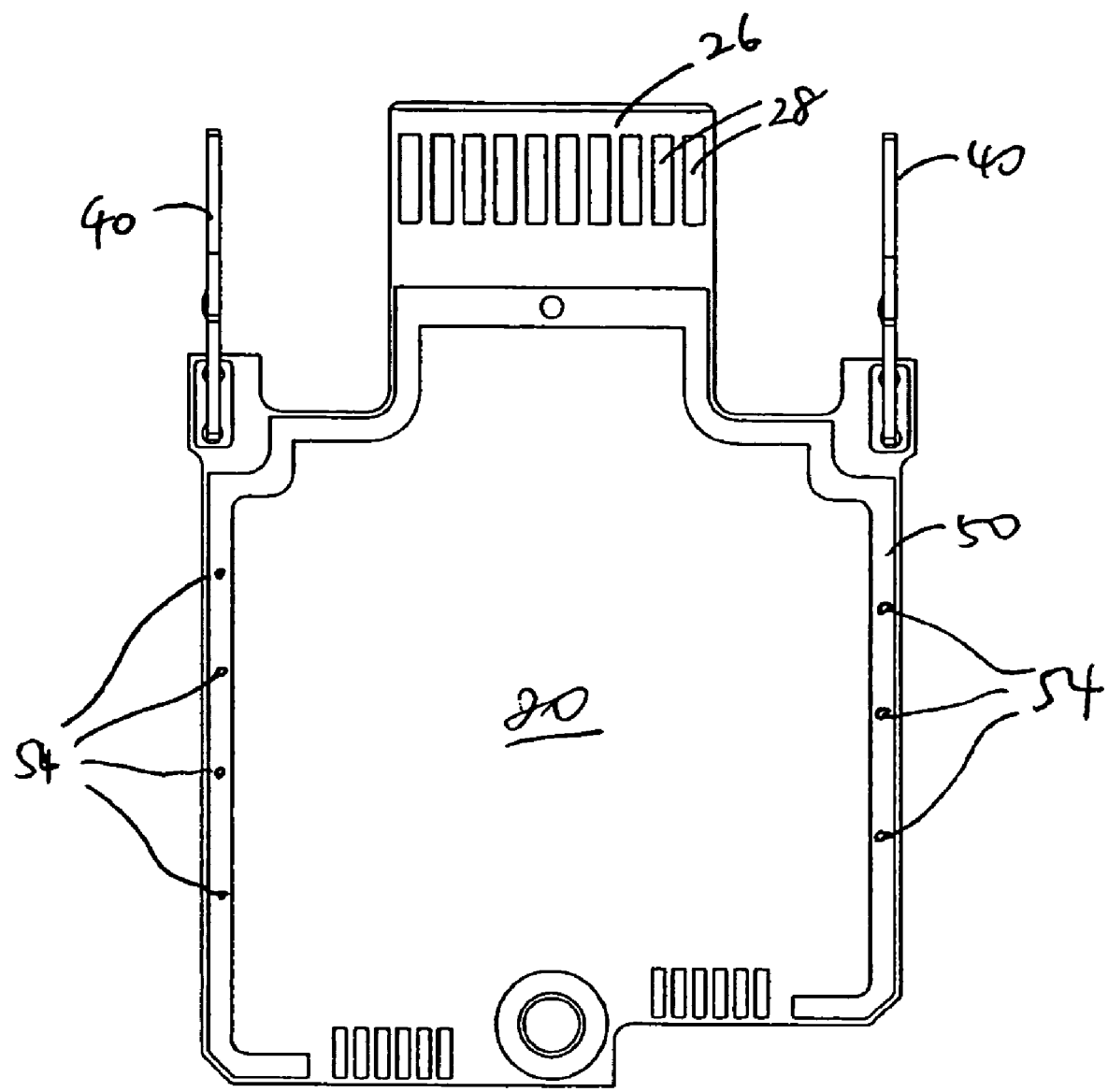

FIG. 2B depicts a top view of the pcb 20. The top view shows that the two pins 40 are positioned apart approximately by the width of the pcb 20. Optionally, the pins 40 may extend farther out than the leads 28 to ensure that they will contact the host device before the leads 28, thus preventing an occurrence of electrostatic discharge that might damage the host device and/or the pcb 20.

Figure 2C:
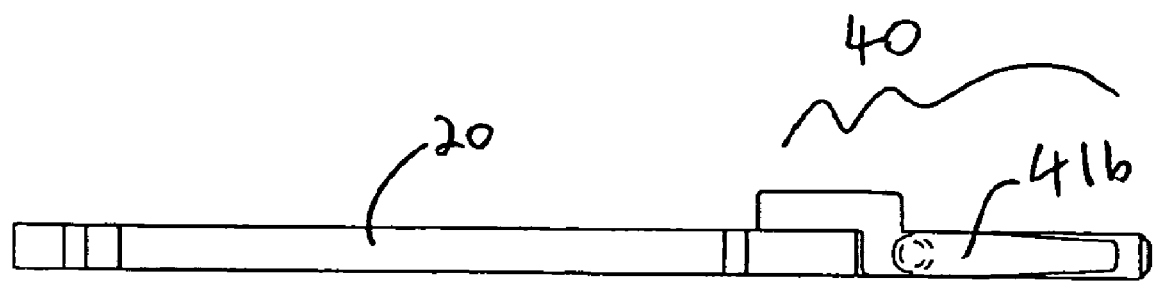

FIG. 2C depicts a side view of the pcb 20. The side view shows that a part of the extension 41b is flush with the bottom surface of the pcb 20. "Bottom," as used herein, refers to the side opposite the side on the pcb 20 through which the pin 40 is inserted. This configuration facilitates the manufacturing process because the pin 40 can be coupled to the board 20 while the board 20 is laid on a surface, and the board 20 does not need to be turned over to insert a pin from the bottom surface. The extension 41b of the pin 40 may have approximately the same thickness as the pcb 20 as shown, although the invention is not so limited.

Figure 3A:
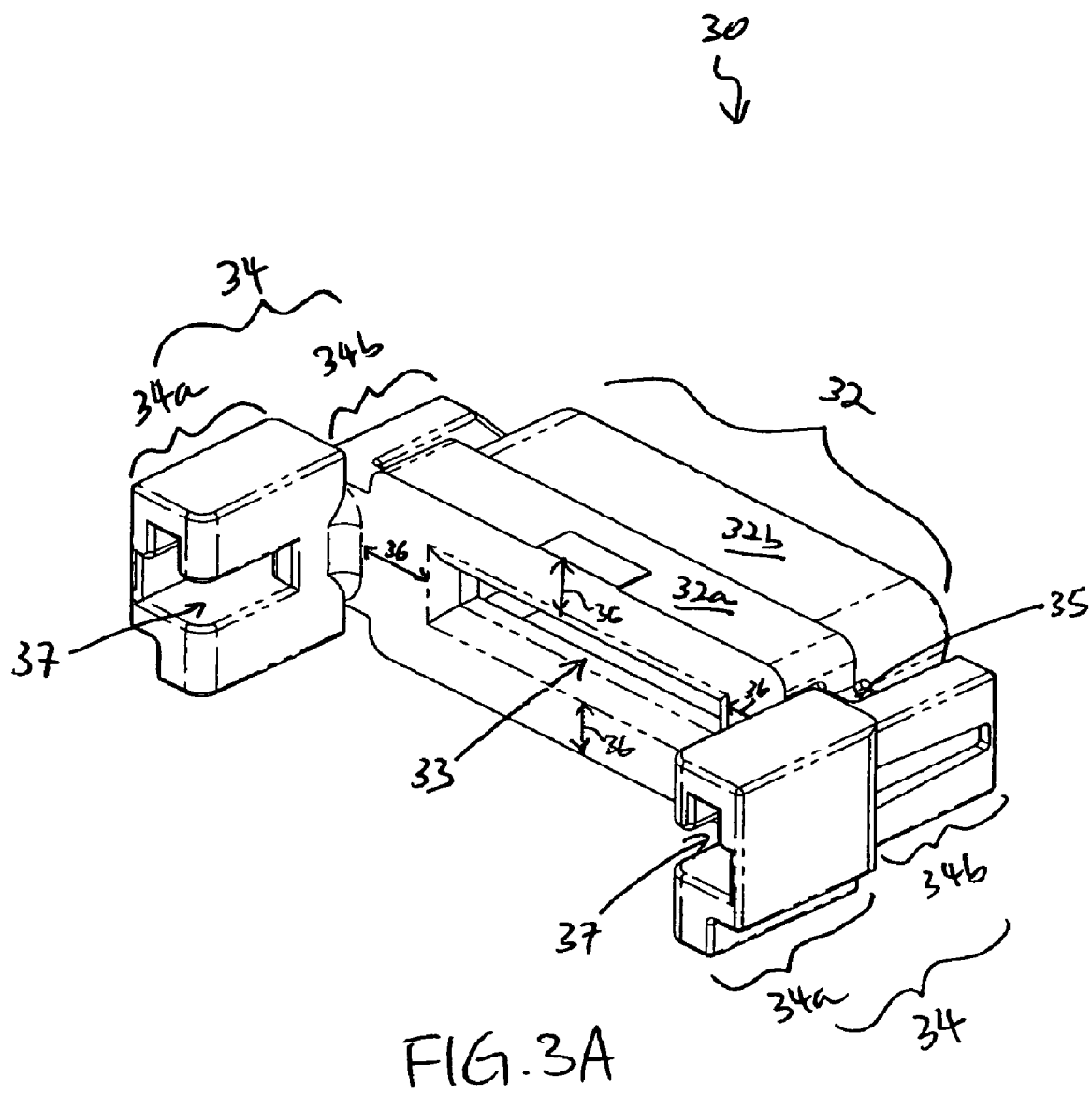
FIG. 3A and FIG. 3B are perspective views of a detachable connector in accordance with the invention from different angles.
Figure 3B:
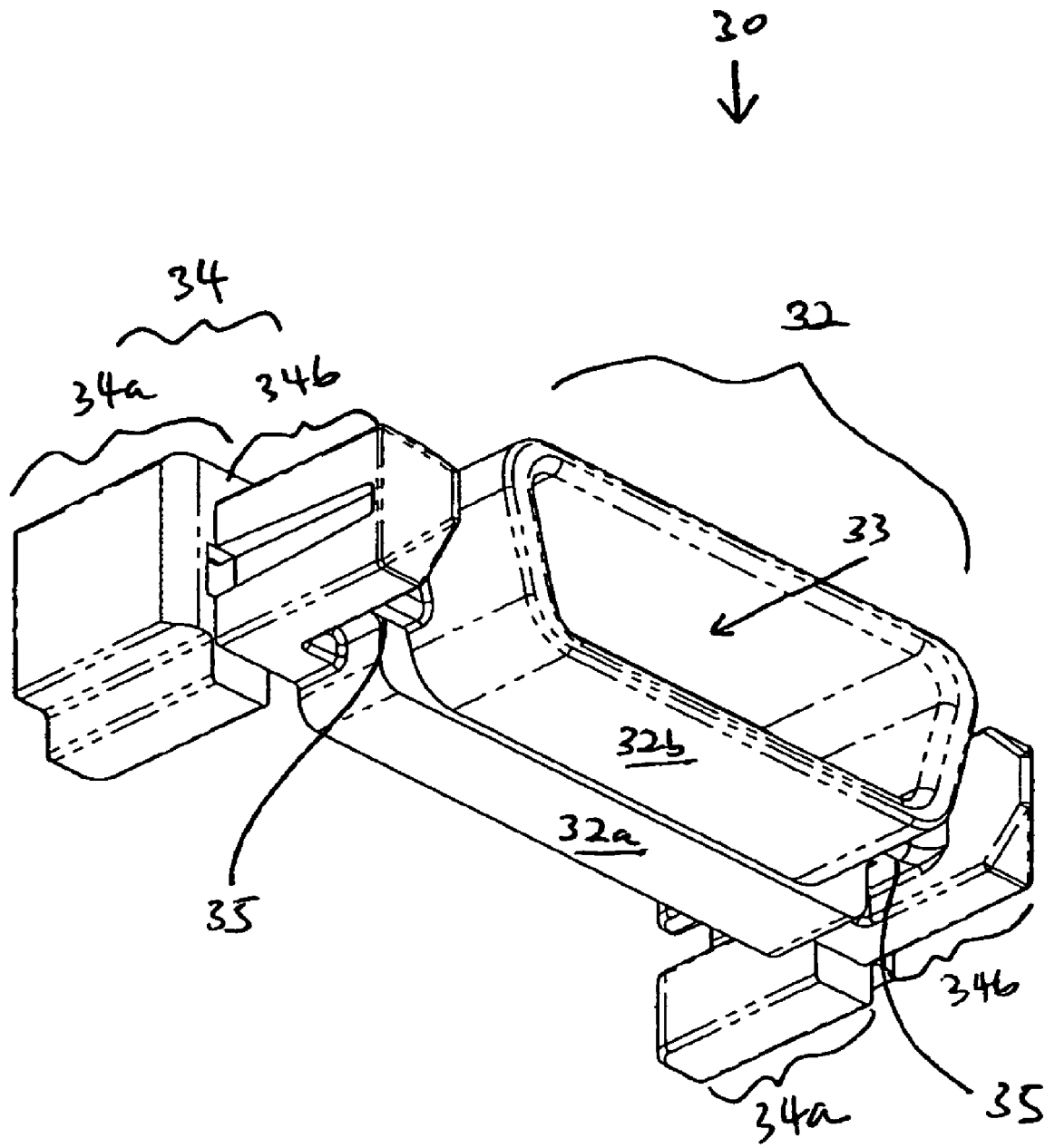

FIGS. 3A and 3B depict a detachable connector 30 in accordance with the invention. FIG. 3A depicts the detachable connector from the pcb-side, while FIG. 3B depicts the detachable connector from the host-device end 24 (see FIG. 2A). The detachable connector 30, which may be made of any rigid material such as plastic, is preferably an integrated unit including a main portion 32 and a pin supporter 34 on each side of the main portion 32, although the invention is not so limited. The main portion 32 includes a first section 32a, a second section 32b, and an opening 33 extending through both sections 32a, 32b. The first section 32a includes an opening 33 formed by thick walls 36. The opening 33 is dimensioned so that when the subsection 26 (see FIG. 2A) extends through the opening 33, there will be only a minimal gap between the subsection 26 and the inner surfaces of the first section 32a. Since the subsection 26 of the pcb fits substantially tightly into the opening 33, the first section 32a couples the connector 30 to the pcb 20 (not shown). The second section 32b has walls that are thinner than the thick walls 36. The difference between the sizes of the opening 33 in the first section 32a and the second section 32b can be seen by comparing FIG. 3A and FIG. 3B, as each view shows the opening 33 from a different angle. When the outer dimensions of the second section 32b are approximately the same as the outer dimensions of the first section 32a, the gap between the subsection 26 and the inner surfaces of the second section 32b will be significantly larger than the gap between the subsection 26 and the inner surfaces of the first section 32a. The thickness of the walls that form the opening 33 can be adjusted to a particular pcb and a particular mating structure at the host device.

The pin supporter 34 includes a reinforcement 34a, an open section 34b, and a channel 37 that runs continuously through both sections. The section of the channel 37 in the reinforcement 34a is designed to accommodate a corner of the pcb 20 that is closest to the pin 40 and the portion of the pin 40 that is adjacent to the pcb 20. By encapsulating the junction of the pin 40 and the pcb 20, the reinforcement 34a provides extra security to the pin-pcb coupling. The open section 34b supports the portion of the pin 40 that contacts the host device. Thus, the open section 34b is shaped to partially encapsulate the pin 40 and provide stability while keeping the critical parts of the pin 40 exposed. Overall, the pin supporter 34 ensures secure attachment of the pin 40 to the pcb 20 and prevents the pin 40 from bending or breaking, thereby ensuring a solid electrical connection between the host device and the pcb 20.

On the outer surface of the detachable connector 30 is a flat area 35. The flat area 35, which may be a sidewall formed by a dip, lies in a plane that is substantially orthogonal to the plane of the pcb 20. In the preferred embodiment, the flat area 35 is located around the intersection of the main portion 32 and the pin supporter 34, on both the top and the bottom. The flat area 35 provides an extra way to secure the coupling of the detachable connector 30 to the pcb 20 by allowing a portion of the module to latch onto the flat area, as described below in more detail.

Figure 4:
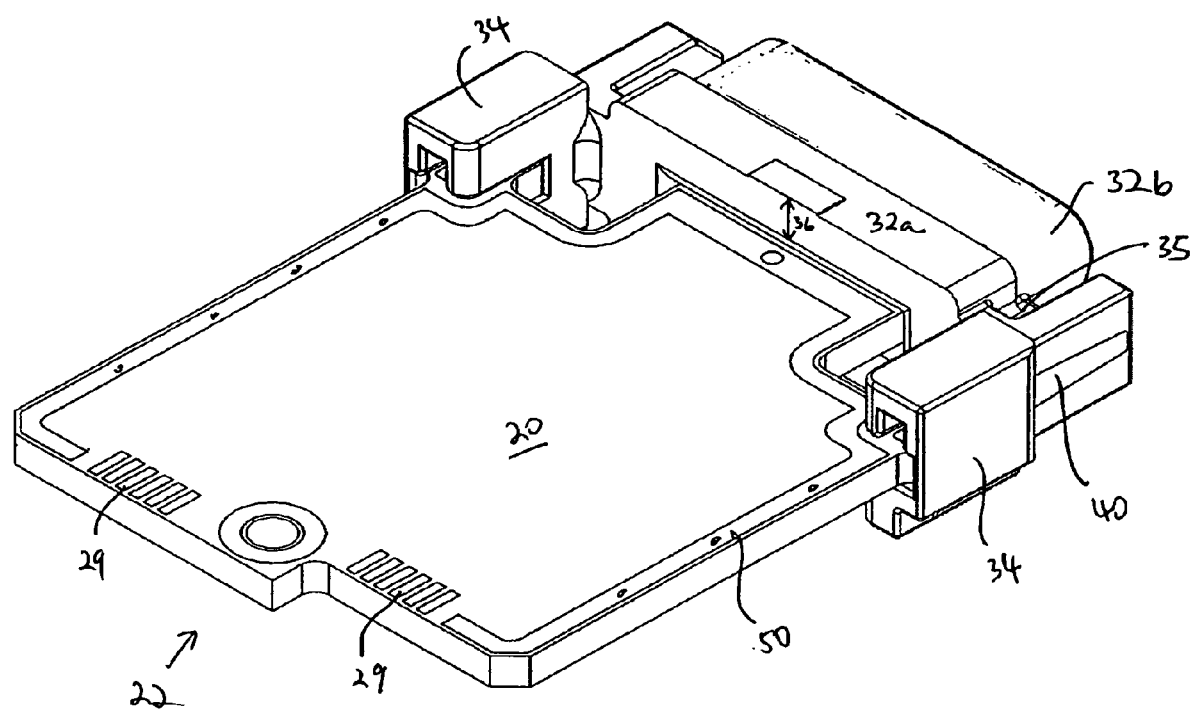
FIG. 4 depicts the printed circuit board of FIG. 2A coupled with the detachable connector of FIG. 3A.

FIG. 4 depicts the printed circuit board 20 of FIG. 2A coupled with the detachable connector 30 of FIG. 3A and FIG. 3B. FIG. 4 shows that the subsection 26 extends through the opening 33 of the first section 32*a* and into the second section 32*b*. Since the opening 33 and the channel 37 are dimensioned to fit tightly around the pcb 20, the detachable connector 30 remains coupled to the pcb 20 without soldering. Thus, the costly hand-soldering step that is part of the current module manufacturing process is not necessary. When using the detachable connector 30, the leads 28 (see FIG. 2A) and the pins 40 (see FIG. 1) do not have to be individually soldered-on for the pcb 20 to be mated to a host device.

Figure 5A:
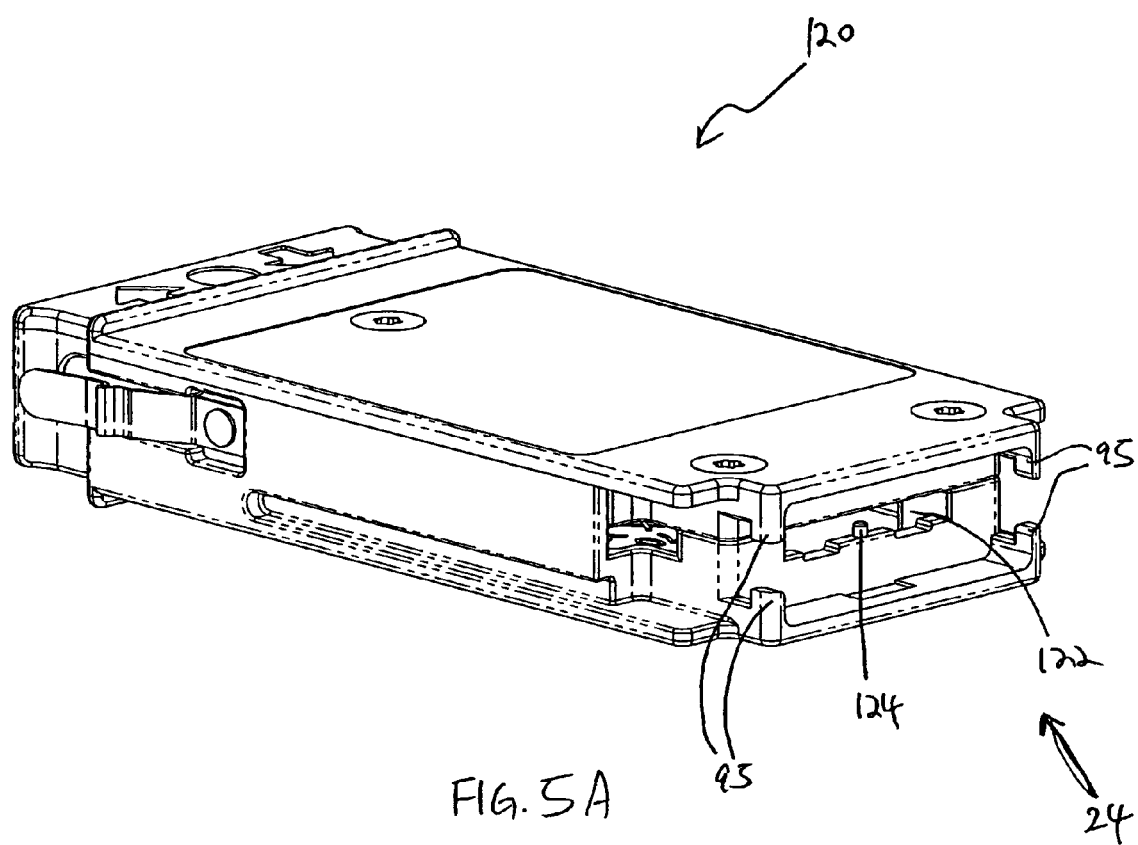
FIG. 5A and FIG. 5B are a perspective view and an end view, respectively, of a module housing that may be used with the invention.

FIG. 5A depicts a module housing 120 that is combined with the pcb 20 and the detachable connector 30 to contain electromagnetic radiation. The module housing 120 is made of a material that blocks electromagnetic radiation, such as metal. As is well known, it is desirable to prevent any electromagnetic radiation emitted by the electrical components on the pcb 20 from escaping the module. Although not clearly shown in FIG. 5A, the module housing 120 is a combination of two partial housings (see FIG. 6A). When the two partial housings are fitted together, a slot 122 forms near the interface of the two partial housings. When the module is assembled, the subsection 26 (see FIG. 2A) of the pcb 20 extends through this slot 122 before extending into the opening 33 (see FIG. 3A) of the detachable connector 30. The slot 122 must provide a minimum clearance so as not to interfere with the electrical signals present on the high speed traces/leads of the pcb 20. As the amount of radiation that can escape through the slot 122 is a function of the frequency of the radiation, the dimensions of the slot 122 may be adjusted according to the expected frequency distribution of the radiation that will be emitted. As data speed increases and the frequency of the emitted radiation rises, the slot 122 needs to be made smaller because higher frequency radiation can escape through smaller openings.

A pole 124 that is positioned on an inner wall of the slot 122 extends into and contacts the chassis-ground hole 52 (see FIG. 2A), minimizing the effective size of the slot 122. The pole 124 is made of an electrically conductive material, preferably the same material as the housing 120, and is chassis-ground like the housing 120. The inner wall of the chassis-ground hole 52 is coated with electrically conductive material. Thus, when the pole 124 is inserted into the hole 52, the length of the longest dimension of the slot 122 is reduced for the purpose of radiation leakage. As stated above, chassis-ground via holes 54 (see FIG. 2A) may be formed anywhere along the chassis-ground section of the pcb 20. The inside wall of each via hole is coated with a conductive material, effectively forming a small, hollow "pole" that connects two chassis-ground sections and reduces the dimension of a nearby opening in the housing. The via holes 54 on the chassis ground ring 50 do not have to extend through the pcb 20. Since each via hole reduces the longest dimension of a nearby opening through which radiation can escape, the via holes provide an effective way of minimizing radiation leakage. More details about via holes are provided in patent application Ser. No. 10/425,090 [which claims priority from Provisional Application No. 60/419,444].

Figure 5B:
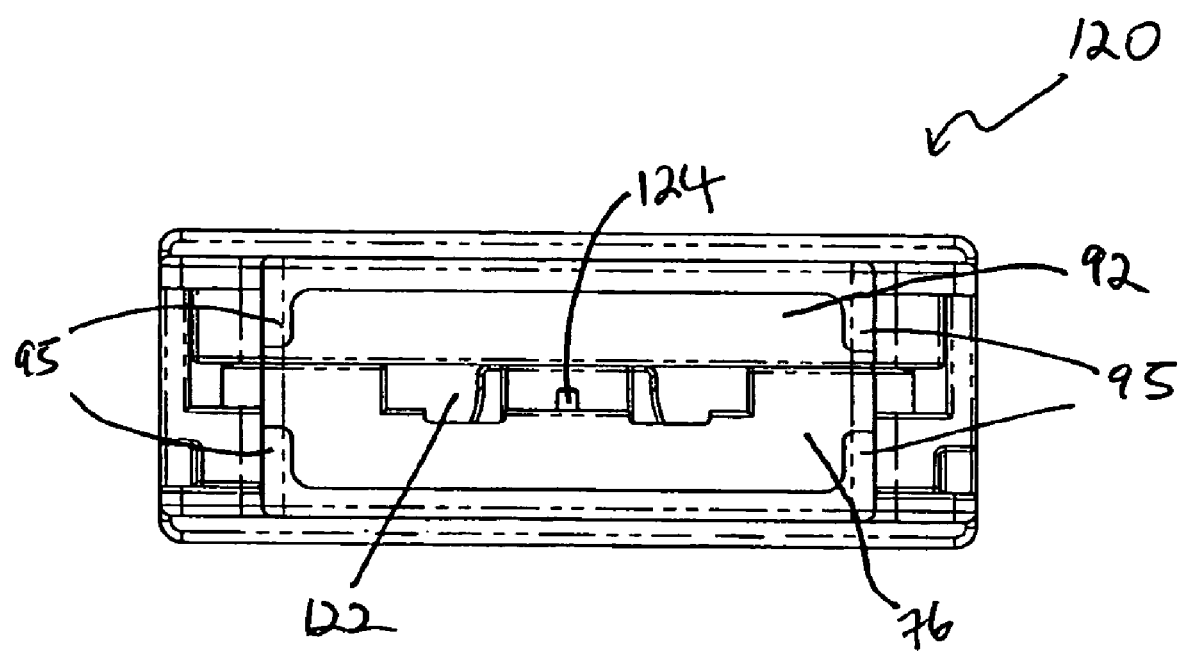

FIG. 5A and FIG. 5B depict a fastening mechanism that includes hooks 95 that protrude substantially orthogonal to the cover and the base on the host device end 24. These hooks 95 help attach the connector 30 to the pcb 20, which are not soldered together. More details on the hooks 95 are provided below.

FIG. 5B depicts the module housing 120 from the host end 24 (see FIG. 5A). FIG. 5B clearly shows an upper wall 92 and an inner wall 76 contacting each other to form the slot 122 and the pole 124 disposed approximately halfway between the longest side of the slot 122. More details about the upper wall 92 and the inner wall 76 will be provided below.

Figure 6A:
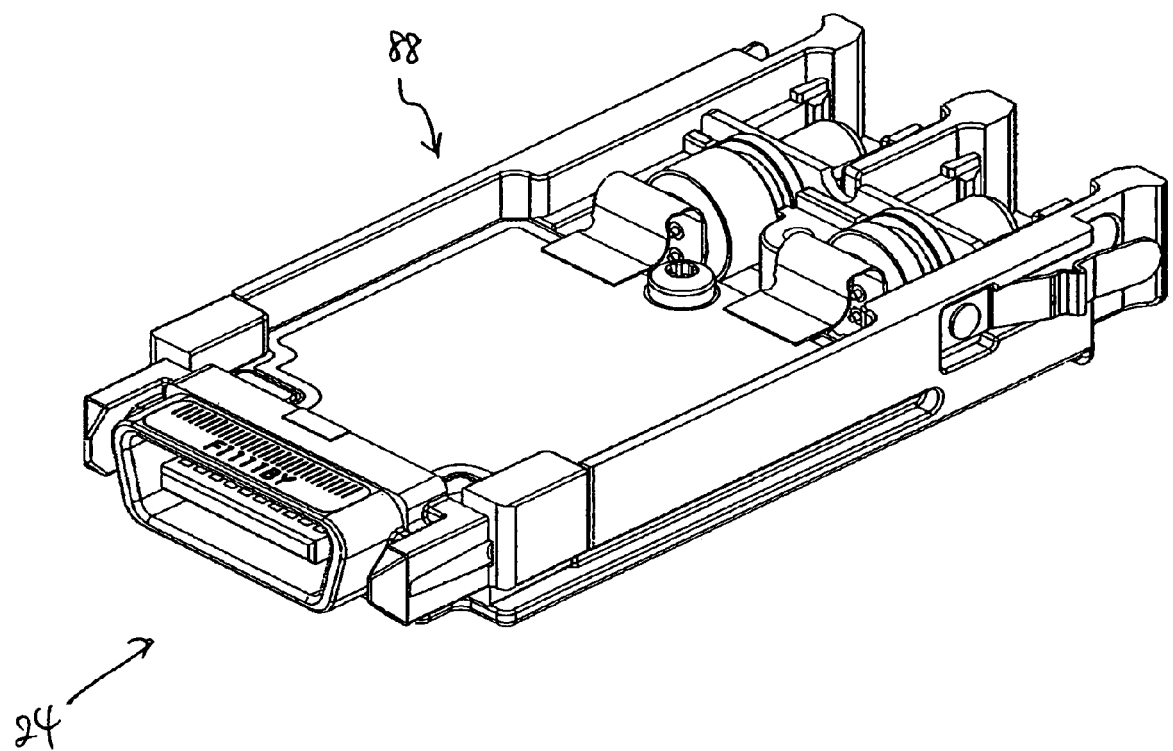
FIG. 6A and FIG. 6B are perspective views of a partially housed transceiver module in accordance with the invention shown from different angles.
Figure 6B:
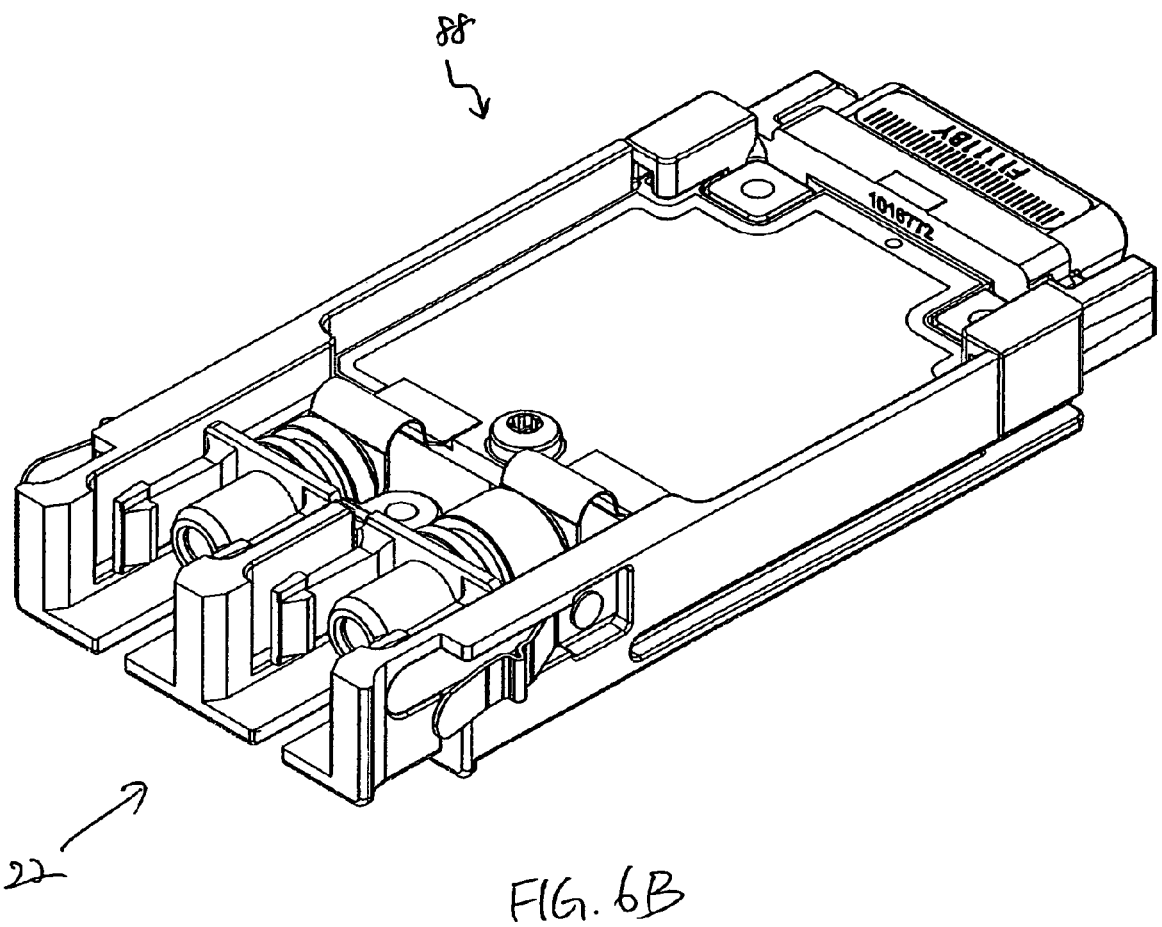

FIG. 6A depicts a partially housed transceiver module 88 from the host device end 24. The partially housed transceiver module 88 includes the assembled pcb 20 secured to the bottom housing 70 with the screw 82. FIG. 6B depicts the partially housed transceiver module 88 of FIG. 6A from the transmission end 22.

Figure 7A:
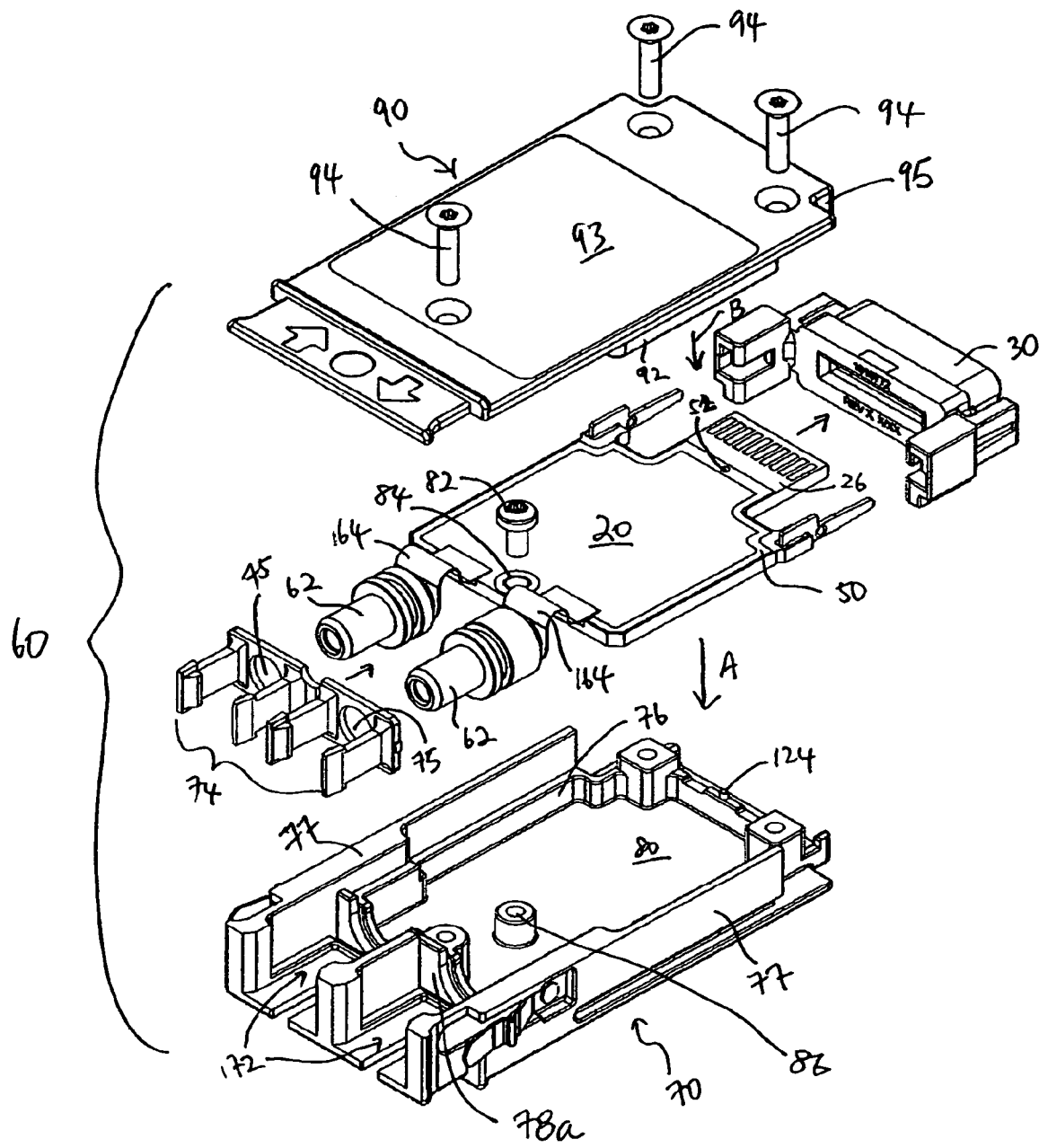
FIG. 7A and FIG. 7B are a top exploded perspective view and a bottom exploded perspective view, respectively, of a transceiver module in accordance with the invention.
Figure 7B:
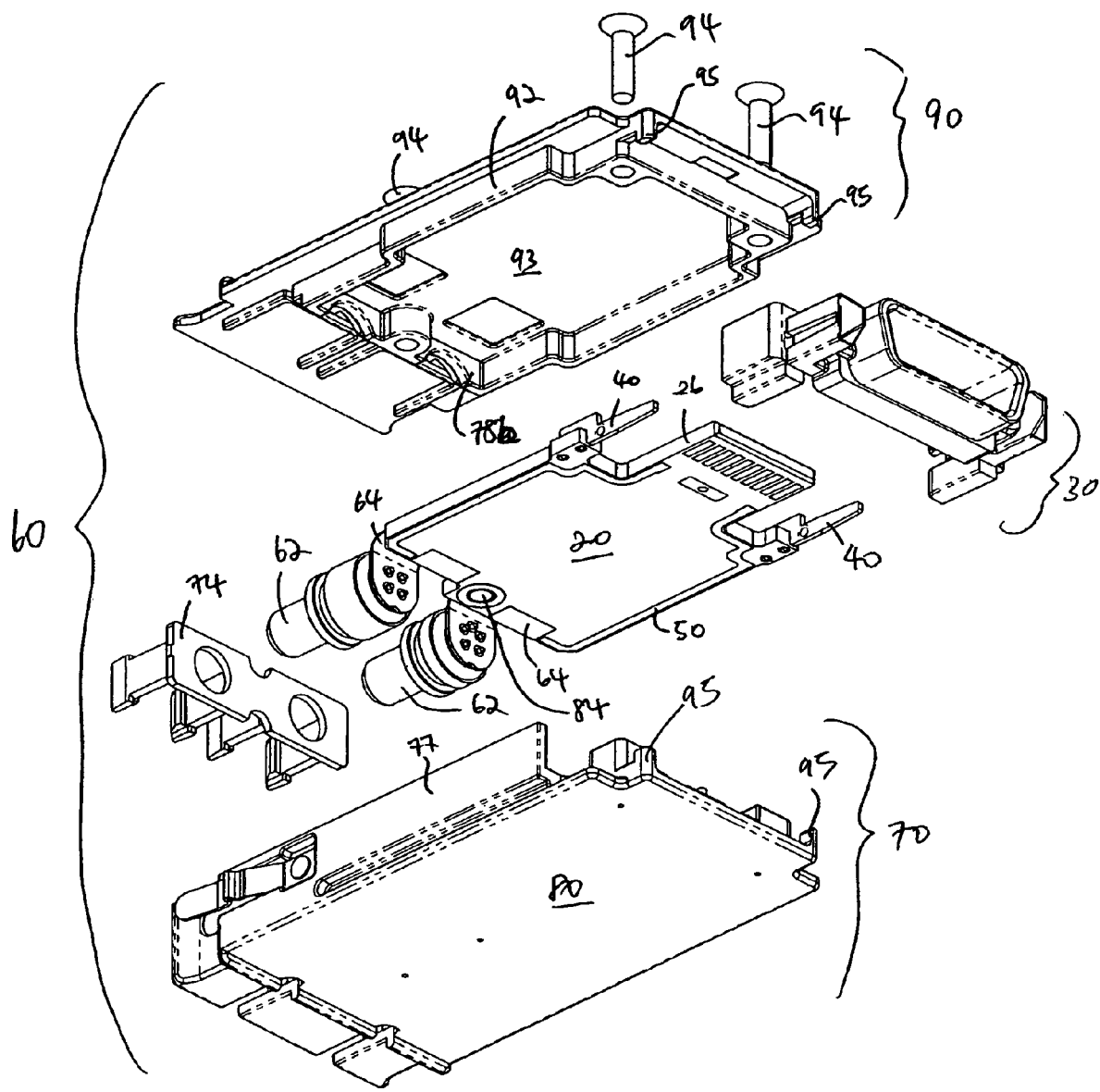

FIG. 7A and FIG. 7B depict an exploded perspective view of an optoelectronic transceiver module 60 in accordance with the invention. The optoelectronic transceiver module 60 includes the pcb 20 and the detachable connector 30 (see FIG. 3A) enclosed in the module housing 120 (see FIG. 5B). In the particular embodiment shown, the pcb 20 is coupled to the pins 40 and modular optical subassemblies 62. The modular optical subassemblies 62, which typically contain a laser, a photodiode, and various other optical elements, are connected to the transmission leads 29 (see FIG. 2A) via ribbon connectors 64. The pcb 20 is then attached to the detachable connector 30 in the manner described above, in reference to FIG. 4. The module housing 120 of FIG. 5A is shown as a bottom housing 70 and a top housing 90. The pcb 20 and the connector 30 are first placed into a bottom housing 70 as indicated by an arrow A, and then the top housing 90 is added as shown by an arrow B. The modular optical subassemblies 62 are positioned in their respective compartments 72 and fixed with a clip 74, which holds detachable fiber optic cables (not shown) into place. The clip 74 is shaped to fit tightly within the compartments 72 and has an opening 75 that is sized to fit the optical subassemblies 62.

FIG. 7A, which is a top exploded perspective view, shows the positions of the inner wall 76 and the outer wall 77 on the bottom housing 70. The inner wall 76 surrounds a region (also referred to as a "second region" herein) of the a base 80 while the outer wall is discontinuous. The base 80 with an external surface and an internal surface, an inner wall 76 positioned along the edge(s) on the internal surface, and an outer wall 77 positioned adjacent to the inner wall 76. An "external surface," as used herein, is the surface that would lie on the outside of the module 60 when the module 60 is completely assembled. An "internal surface" is the surface that would lie on the inside of the module 60 upon complete assembly. Preferably, the bottom inner wall 76 extends continuously along three edges and turns into a lower curved support structure 78*a* for supporting the modular optical subassemblies 62. As shown, the lower curved support structure 78*a* separates the compartments 72 that house the optical subassemblies from the rest of the housing 70 that houses the pcb 20. The bottom inner wall 76 is designed so that when the pcb 20 rests on it, the inner wall 76 comes in contact with the chassis ground section (not shown) at the bottom surface of the pcb 20. A screw 82 may extend through a hole 84 on the pcb 20 and be threaded into an opening 86 in the bottom housing 70.

FIG. 7B, which is a bottom exploded perspective view, shows the position of the upper wall 92 on the upper housing 90. The upper wall 92, which is formed on the internal surface of a planar cover 93, surrounds a region of the upper wall. (This region is also referred to as the "first region"). The upper wall 92 extends along the edges and turns into the upper curved support structure 78b that, when combined with the lower curved support structure 78a, is designed to hold the modular assemblies 62 in place. The upper wall 92, which forms a pattern that is substantially a mirror image of the pattern formed by the inner wall 76, contacts the chassis ground ring 50 when the top housing 90 is combined with the partially housed transceiver module 88 (see FIG. 6A). The dimensions of the upper wall 92, the inner wall 76, and the bottom outer wall 77 are determined according to the thickness of the pcb 20, to ensure that electromagnetic radiation will be contained as much as possible.

In accordance with the invention, the upper wall 92, the inner wall 76, and the bottom outer wall 77 are dimensioned to tolerate some variance in the thickness of the pcb 20 without compromising the effectiveness of electromagnetic radiation containment. When the pcb 20 has a thickness above a certain threshold thickness, electromagnetic radiation is contained by two layers of sidewalls: a first layer including the upper wall 92 and the inner wall 76 sandwiching the pcb 20, and a second layer that includes the outer wall 77. The upper wall 92 and the inner wall 76 press on opposite surfaces of the pcb 20 and are fixed in position with screws 94. Preferably, the parts of the upper wall 92 and the inner wall 76 that contact each other are lined with an electrically conductive material (not shown) that is softer than the metal that the module housing is made of (e.g., conductive rubber) to achieve a better seal at the interface. The height of the upper wall 92 is such that when the upper wall 92 is coupled to the chassis ground ring 50 of the pcb 20, electrical components on the upper surface of the pcb 20 will not touch the cover 93. Likewise, the bottom inner wall 76 provides sufficient clearance for the electrical components on the lower surface of the pcb 20 (if any) when the pcb 20 rests on the bottom inner wall 76. The top housing 90 and the bottom housing 70 contact only the chassis ground sections of the pcb 20 so that they do not affect the circuitry on the pcb 20. Thus, when the pcb 20 is thick enough to contact the upper wall 92, radiation is contained within the space defined by the inner wall 76, the upper wall 92, the cover 93, and the base 80. Any radiation that escapes this first layer of radiation shield is blocked by the outer wall 77, which contacts the cover 93 to form a second layer of radiation shield.

When the thickness of the pcb 20 is below the threshold thickness, the upper wall 92 does not contact the chassis ground ring 50 because the cover 93 lodges on the bottom outer wall 77 of the bottom housing 70. Thus, the upper wall 92 and the inner wall 76 do not form the first layer of radiation shield when the pcb 20 is thin. However, the outer wall 77 still acts as the radiation shield. The cover 93 makes firm contact with the outer wall 77 and are fixed in place by screws 94. The area of the cover 93 that is near the edges or the outer wall 77 may be partially lined with conductive rubber to achieve a better seal at the interface. Thus, for a thin pcb 20, radiation is contained within the space defined by the cover 93, the base 80, and the outer wall 77.

Near the host device end 24, the upper wall 92 and the inner wall 76 form a layer of radiation shield. This radiation shield being positioned between the electrical components of the pcb 20 and the detachable connector 30, not much radiation reaches the detachable connector 30. Thus, even if the detachable connector is made of plastic, radiation is unlikely to reach the host device that is coupled with the subsection 26. The electrically isolated pins 40 are positioned outside of the radiation shield, since they will be connected to the host device.

The upper housing 90 has a hook 95 that is positioned and shaped to latch onto the sidewall formed by the flat area 35 (see FIG. 3A) of the detachable connector 30. As mentioned above, the detachable connector 30 is not soldered onto the pcb 20. The hook 95 securely fastens the detachable connector 30 to the rest of the module 60 to provide an extra layer of security that the connector 30 will not separate itself from the pcb 20 during operation. The hook 95 may be substituted or supplemented with any conventional fastening mechanism that a person of ordinary skill in the art would deem suitable.

Figure 8:
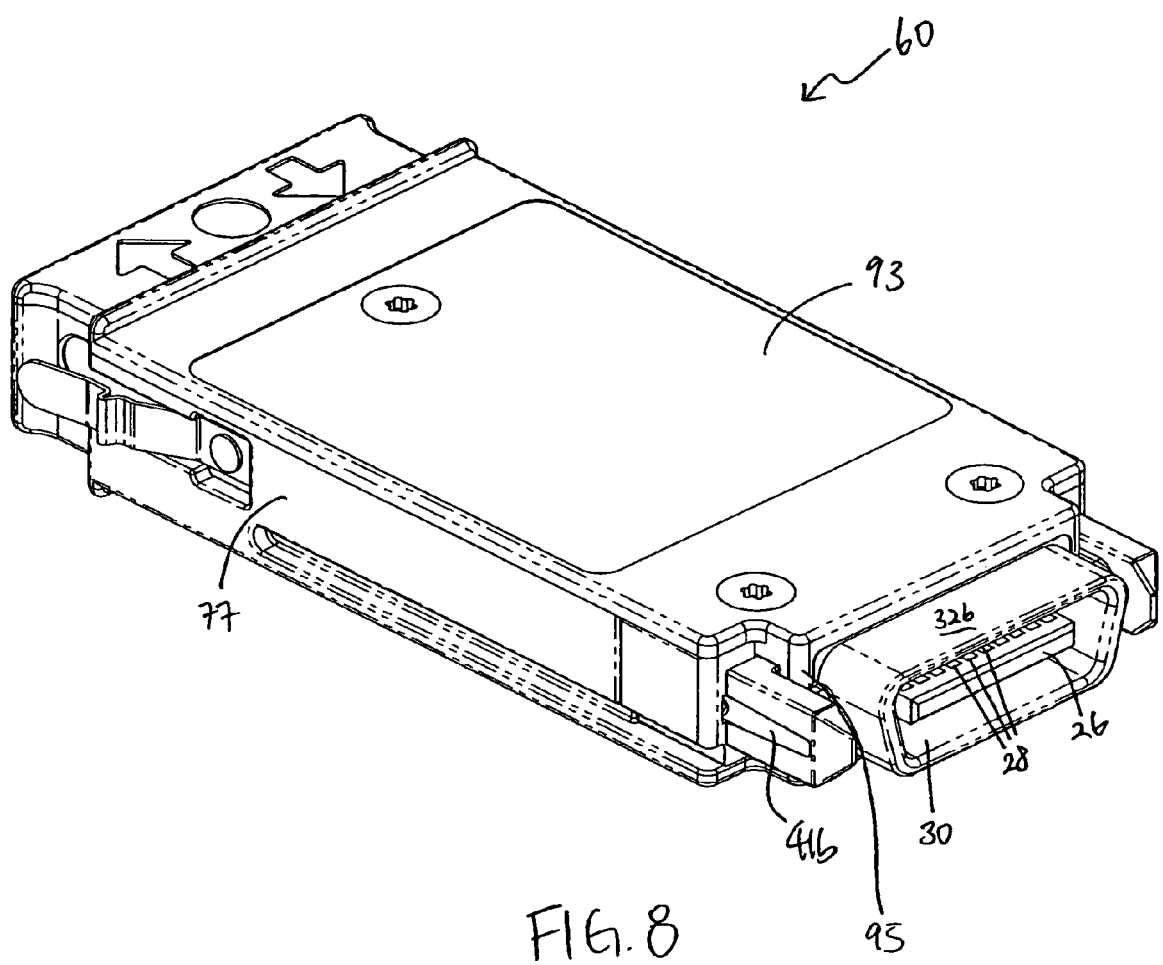
FIG. 8 provides a perspective view of a completely assembled transceiver module in accordance with the invention.

FIG. 8 depicts a completely assembled transceiver module 60. When completely assembled, the transceiver module 60 is completely enshrouded in a radiation-shielding housing with the exception of the parts that need to be exposed to connect to the host device: the leads 28 on the subsection 26 and the extension 41b of the pins 40.

A person of ordinary skill in the art would understand that various modifications may be made to the module connector described herein without straying from the scope of the invention.

What is claimed is:

1. An electronic module comprising:
   a printed circuit board including a set of exposed electrical leads configured and arranged to physically and electrically interface with corresponding conductive elements of a host device;
   a detachable connector removably attached to the printed circuit board and configured to interface with corresponding structure of the host device, the detachable connector having an opening within which a portion of the printed circuit board is received; and
   a housing within which the printed circuit board and at least a portion of the detachable connector are disposed.

2. The module of claim 1 further comprising a connecting pin attached to the printed circuit board, the connecting pin extending into the detachable connector.

3. The module of claim 2 wherein the detachable connector has a pin supporter comprising:
   a reinforcement section that fits around a junction of the connecting pin and the printed circuit board; and
   an open section that supports the connecting pin while keeping a part of the connecting pin exposed.

4. The module of claim 2, wherein the electrical connecting pin comprises a signal ground pin.

5. The module of claim 4, further comprising electrical leads positioned on the portion of the printed circuit board received within the opening of the detachable connector, wherein the electrical connecting pin extends relatively further out from an edge of the printed circuit board than the electrical leads extend from the edge of the printed circuit board.

6. The module of claim 1 further comprising a modular optical subassembly coupled to the printed circuit board.

7. The module of claim 1, wherein the housing is made of a material that shields electromagnetic radiation.

8. The module of claim 7, wherein a part of the housing forms a wall between electrical components on the printed circuit board and the detachable connector.

9. The module of claim 8, wherein the wall has a slot through which the portion of the printed circuit board extends.

10. The module of claim 9, wherein the wall is electrically connected to a chassis ground of the printed circuit board.

11. The module of claim 1, wherein the detachable connector is coupled to the printed circuit board by a solderless connection.

12. The module of claim 11, wherein the portion of the printed circuit board being received into the detachable connector comprises a portion of the solderless connection.

13. The module of claim 1, wherein the module comprises an optoelectronic transceiver.

14. The module of claim 1, wherein the detachable connector comprises:
- a first section that defines a first portion of the opening; and
- a second section that defines a second portion of the opening.

15. The module of claim 14, wherein the first section has a configuration that is different from a configuration of the second section.

16. The module of claim 1, wherein the housing defines a slot in communication with the opening, at least a portion of the slot being blocked.

17. The module of claim 16, wherein a dimension of the slot corresponds with a particular EMI effect.

18. The module of claim 16, wherein the portion of the slot is blocked by a structure that comprises an element of a chassis ground system of the module.

19. The module of claim 18, wherein the chassis ground system comprises first and second partial housings of the housing.

20. An electronic module comprising:
- a printed circuit board in a housing including a set of exposed electrical leads configured and arranged to physically and electrically interface with corresponding conductive elements of a host device;
- a first modular optical subassembly including an optical detector in electrical communication with circuitry of the printed circuit board;
- a second modular optical subassembly including an optical transmitter in electrical communication with the circuitry of the printed circuit board;
- first and second compartments, at least partially defined by the housing, within which respective portions of the first and second modular optical subassemblies reside, each of the first and second compartments having a configuration that corresponds to a respective portion of an optical connector; and
- a detachable connector coupled to the printed circuit board and configured to interface with corresponding structure of a host device by a solderless connection, the detachable connector having an opening within which a portion of the printed circuit board is received.

21. An optoelectronic transceiver module comprising:
- a printed circuit board;
- one or more optical components physically coupled to the printed circuit board, the one or more optical components including at least one of a laser diode, a photodiode, and a lens;
- an electrical connecting pin attached to the printed circuit board;
- a detachable connector coupled to the printed circuit board, the detachable connector having an opening within which a portion of the printed circuit board is received and the detachable connector also having a channel within which a portion of the electrical connecting pin is removably received; and
- a housing within which the printed circuit board is disposed, the housing including a mechanical fastening mechanism that engages a portion of the detachable connector.

22. An electronic module comprising:
- a housing;
- a printed circuit board disposed within the housing including a set of exposed electrical leads configured and arranged to physically and electrically interface with corresponding conductive elements of a host device;
- a detachable connector electrically coupled to the printed circuit board, the detachable connector having an opening within which a portion of the printed circuit board is received; and
- one or more electrical connecting pins attached to the printed circuit board, the one or more connecting pins extending into the detachable connector.

* * * * *

UNITED STATES PATENT AND TRADEMARK OFFICE
CERTIFICATE OF CORRECTION

PATENT NO. : 7,508,677 B2 Page 1 of 2
APPLICATION NO. : 10/928414
DATED : March 24, 2009
INVENTOR(S) : Ice et al.

It is certified that error appears in the above-identified patent and that said Letters Patent is hereby corrected as shown below:

Drawings
Sheet 2, replace Figure 2A with the figure depicted below, wherein the reference number "41" has been changed to --41a--, the reference number "40" has been changed to --41b--, and a new reference number "40" has been added.

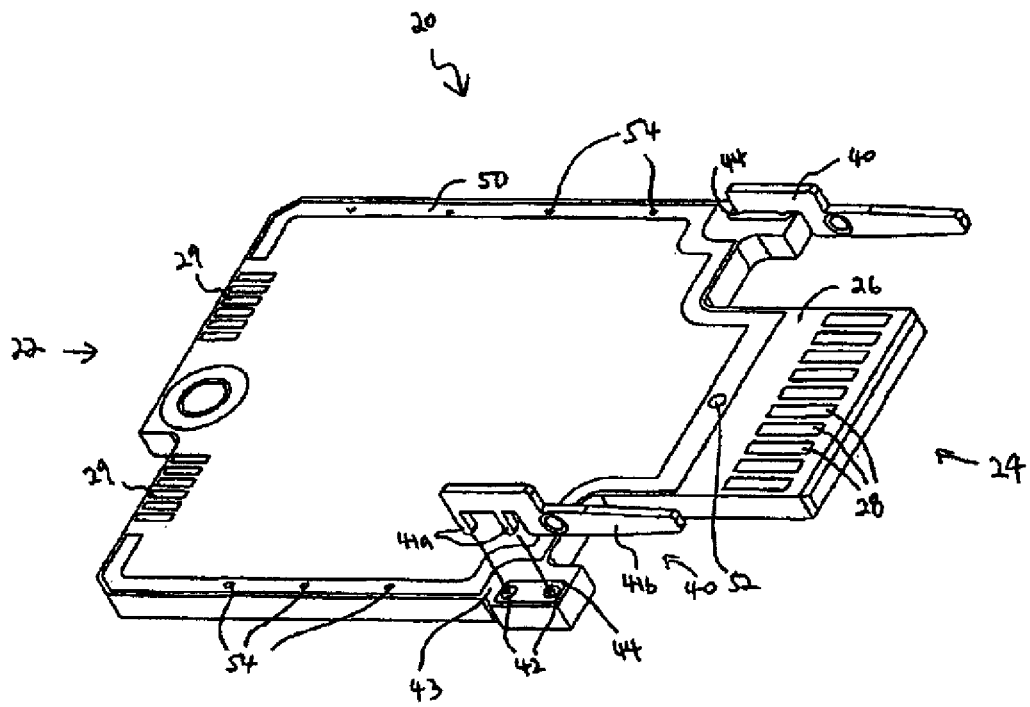

Signed and Sealed this
Nineteenth Day of April, 2011

David J. Kappos
*Director of the United States Patent and Trademark Office*

CERTIFICATE OF CORRECTION (continued)
U.S. Pat. No. 7,508,677 B2

Sheet 12, replace Figure 7A with the figure depicted below, wherein two reference numbers "40" have been added, both instances of "164" have been changed to --64-- and reference number "172" has been changed to --72--

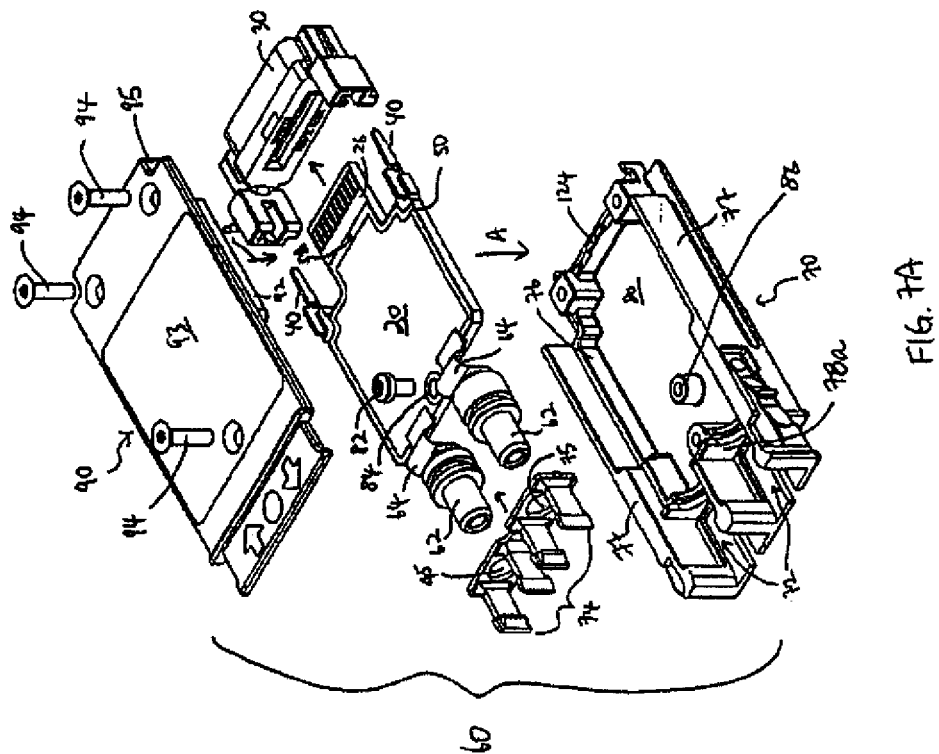

Column 2
Line 9, change "leakage" to --leaks--

Column 3
Line 36, change "FIG. 1" to --FIG. 2A--
Line 42, change "is" to --are--
Line 49, change "FIG. 2" to --FIG. 2A--
Line 52, change "hole" to --holes--
Line 58, change "hole" to --holes--

Column 4
Line 31, change "pcb" to --pcb 20--

Column 5
Line 4, change "flat area" to --flat area 35--

Column 6
Line 42, change "of the a base" to --of a base--